(12) United States Patent
Kang

(10) Patent No.: US 6,510,072 B2
(45) Date of Patent: Jan. 21, 2003

(54) NONVOLATILE FERROELECTRIC MEMORY DEVICE AND METHOD FOR DETECTING WEAK CELL USING THE SAME

(75) Inventor: Hee Bok Kang, Daejeon-shi (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/000,064

(22) Filed: Dec. 4, 2001

(65) Prior Publication Data

US 2002/0093846 A1 Jul. 18, 2002

(30) Foreign Application Priority Data

Dec. 4, 2000 (KR) ............................................. 00-72918

(51) Int. Cl.$^7$ ............................................... G11C 11/22
(52) U.S. Cl. ................... 365/145; 365/149; 365/185.23
(58) Field of Search ................................ 365/145, 149, 365/185.08, 201, 185.04, 185.23

(56) References Cited

U.S. PATENT DOCUMENTS

| | | | |
|---|---|---|---|
| 4,873,664 A | 10/1989 | Eaton, Jr. .................... | 365/145 |
| 5,424,975 A | 6/1995 | Lowrey et al. .............. | 365/145 |
| 5,432,731 A | 7/1995 | Kirsch et al. ................ | 365/145 |
| 5,532,953 A | * 7/1996 | Ruesch et al. .............. | 365/145 |
| 5,541,872 A | 7/1996 | Lowrey et al. .............. | 365/142 |
| 5,638,318 A | 6/1997 | Seyyedy ...................... | 365/145 |
| 5,680,344 A | 10/1997 | Seyyedy ...................... | 365/145 |
| 5,682,344 A | 10/1997 | Seyyedy ...................... | 365/145 |
| 5,815,430 A | * 9/1998 | Verhaeghe et al. ......... | 365/145 |
| 6,125,051 A | * 9/2000 | Kang .......................... | 365/145 |

* cited by examiner

Primary Examiner—Tan T. Nguyen
(74) Attorney, Agent, or Firm—Birch, Stewart, Kolasch & Birch, LLP

(57) ABSTRACT

A nonvolatile ferroelectric memory device and a method for detecting a weak cell using the same are provided. The nonvolatile ferroelectric memory device includes: a nonvolatile ferroelectric memory cell driver including a top cell array and a bottom cell array, a sensing amplifier formed between the top and bottom cell arrays for sensing the top and bottom cell arrays, and a wordline driver for driving a wordline of the top and bottom cell arrays; an X-decoder for selectively outputting a wordline decoding signal to the wordline driver; and a pulse width generating unit for varying a width of a restore pulse PW1 and outputting the varied width to the wordline driver to detect a weak cell of the top and bottom cell arrays.

18 Claims, 12 Drawing Sheets

INPUT (pre-pw1)

PW1

PW1

PW1

NONVOLATILE FERROELECTRIC MEMORY DEVICE AND METHOD FOR DETECTING WEAK CELL USING THE SAME

BACKGROUND OF THE INVENTION

1. Field of the Invention

The present invention relates to a semiconductor memory device, and more particularly, to a nonvolatile ferroelectric memory device and method for detecting a weak cell using the same.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and a second terminal is connected with the plate line P/L.

In the related art nonvolatile ferroelectric memory including unit cells, weak cells occur due to defect of the ferroelectric capacitor of each unit cell.

To detect such weak cells, an offset sensing amplifying circuit shown in FIG. 3 is typically used. That is, a sensing margin is varied by adding an offset voltage to a sensing voltage of a bit line.

A method for detecting weak cells using the related art nonvolatile ferroelectric memory will be described with reference to the accompanying drawings.

FIG. 3 is a diagram of an offset control circuit of a related art sensing amplifier, and FIG. 4 is a graph showing the variation of an offset voltage according to a bitline voltage during a reading mode of the cell.

As shown in FIG. 3, the offset control circuit of the related art sensing amplifier includes a bitline, a bitline bar, a first inverter, and a second inverter. The first inverter inverts a bitline signal between the bitline and the bitline bar, and the second inverter inverts a bitline bar signal and outputs the inverted signal to the bitline.

A first switching transistor and a first offset capacitor are provided between the bitline and a driver while a second switching transistor and a second offset capacitor are provided between the bitline bar and the driver.

At this time, the first switching transistor transmits the bitline signal to the driver through the offset capacitor while the second switching transistor transmits the bitline bar signal to the driver through the offset capacitor.

The related art method for detecting weak cells is performed using the offset control circuit shown in FIG. 3. In this method, the sensing margin is varied by adding the offset voltage to the bitline sensing voltage.

In other words, addition of an offset to a normal bitline level breaks loading balance of the bitline, and an operational margin of a sensing amplifier is reduced during sensing operation. Thus, weak cells are detected.

FIG. 4 is a graph showing variation of an offset voltage according to a bitline voltage during related art reading mode. Referring to FIG. 4, if the bitline voltage is small during the reading mode, the offset voltage applied to the bitline becomes small. If the bitline voltage is great, the offset voltage becomes grater.

The related art method for detecting weak cells using the related art nonvolatile ferroelectric memory has several problems.

Since a separate offset capacitor is required to detect the weak cells, the process becomes complicated. If the process conditions are varied, a normal bitline level is varied. This may cause an error in detecting the weak cells.

SUMMARY OF THE INVENTION

An object of the invention is to solve at least the above problems and/or disadvantages and to provide at least the advantages described hereinafter.

Another object of the present invention is to provide a nonvolatile ferroelectric memory device and method for detecting a weak cell using the same in which a separate test mode is not required, and a weak cell is easily detected and eliminated even if process conditions are varied.

To achieve at least these objects and other advantages in a whole or in part and in accordance with the purpose of the present invention, as em bodied and broadly described, a nonvolatile ferroelectric memory device according to the present invention includes: a nonvolatile ferroelectric memory cell driver including a top cell array and a bottom cell array, a sensing amplifier formed between the top and bottom cell arrays, for sensing the top and bottom cell arrays, and a wordline driver for driving a wordline of the top and bottom cell arrays; an X-decoder for selectively outputting a wordline decoding signal to the wordline driver; and a pulse width generating unit for varying a width of a restore pulse PW1 and outputting the varied width to the wordline driver to detect a weak cell of the top and bottom cell arrays.

To further achieve the above objects in a whole or in part according to the present invention, a method for detecting a weak cell using a nonvolatile ferroelectric memory device including a nonvolatile ferroelectric memory cell driver having a top cell array and a bottom cell array, a sensing amplifier for sensing the top and bottom cell arrays, and a wordline driver for driving a wordline of the top and bottom cell arrays, includes the steps of:

selectively outputting a wordline decoding signal to the wordline driver; varying a width of a restore pulse PW1 and outputting the restored pulse having a varied width to the wordline driver to detect a weak cell of the upper and lower cell arrays; controlling data(charge amount) to be stored in a memory cell of each cell array to correspond to the size of the output restore pulse PW1 and outputting bitline sensing levels varied to correspond to the size of the restore pulse; and sensing a memory cell that reaches a minimum sensing level among the varied bitline sensing levels to determine a weak cell.

These and other objects of the present application will become more readily apparent from the detailed description given hereinafter. However, it should be understood that the detailed description and specific examples, while indicating preferred embodiments of the invention, are given by way of illustration only, since various changes and modification within the spirit and scope of the invention will become apparent to those skilled in the art from this detailed description.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

In the present invention, it is intended that a weak cell is eliminated in advance to ensure reliability of a nonvolatile ferroelectric memory chip. That is, an operational pulse width of a cell is varied to control data to be stored in the cell, so that a bitline sensing level is varied. A sensing input voltage of a sensing amplifier is varied to allow a weak cell to reach a minimum sensing level, thereby eliminating the weak cell.

A nonvolatile ferroelectric memory device and method for detecting a weak cell using the same will now be described with reference to the accompanying drawings.

Figure 5:
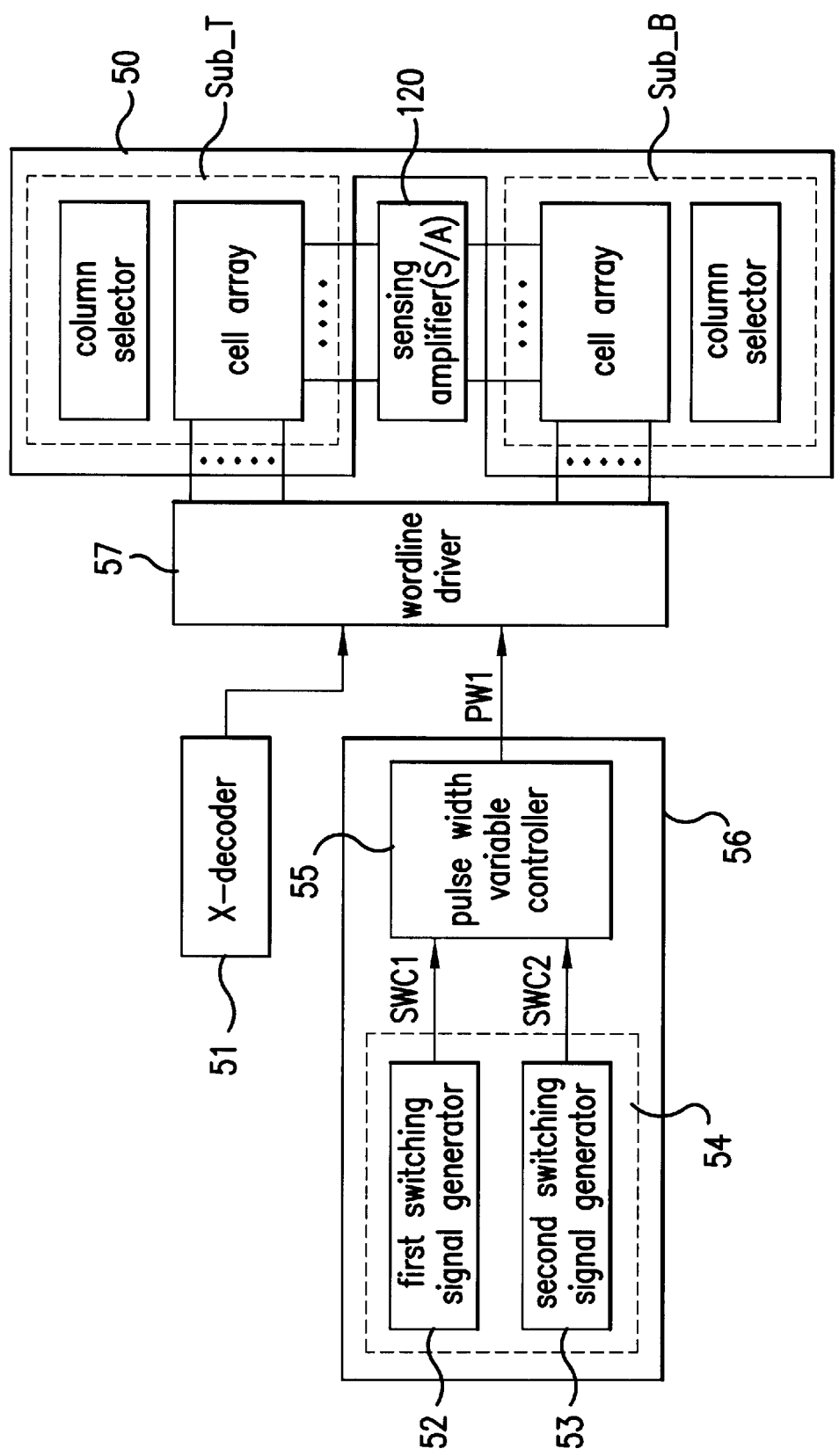
FIG. 5 is a schematic view of a nonvolatile ferroelectric memory device according to an embodiment of the present invention.

First, as shown in FIG. 5, the nonvolatile ferroelectric memory device of the present invention includes a memory cell array 50, a wordline driver 57, an X-decoder 51 for driving the wordline driver 57, and a pulse generator 56 for detecting a weak cell of the memory cell array 50.

Figure 6:
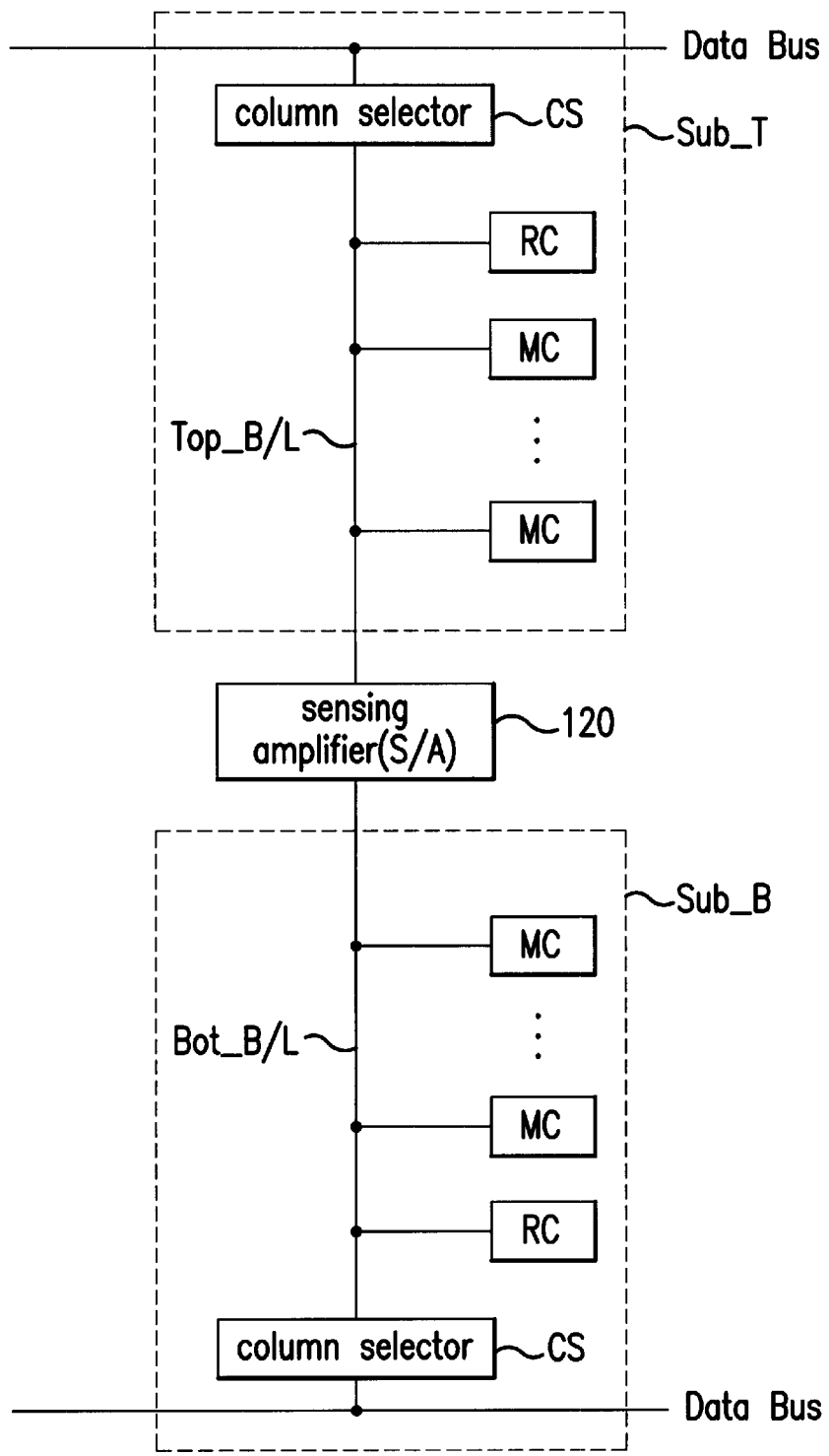
FIG. 6 is a schematic view of a memory cell array according to the nonvolatile ferroelectric memory device of FIG. 5.

The memory cell array 50, as shown in FIGS. 5 and 6, includes a plurality of sub cell arrays. A sensing amplifier S/A 120 is formed between adjacent top and bottom sub cell arrays sub_T and sub_B.

As shown in FIG. 6, each of the sub cell arrays includes bitlines Top_B/L and Bot_B/L, a plurality of main cells MC connected to the bitlines Top_B/L and Bot_B/L, a reference cell RC connected to the bitlines Top_B/L and Bot_B/L, and a column selector CS.

The reference cell RC within the sub cell array sub_T formed in a top portion of the sensing amplifier S/A is simultaneously accessed when the main cell MC within the sub cell array sub_B is accessed.

On the other hand, the reference cell RC within the sub cell array sub_B formed in a bottom portion of the sensing amplifier S/A is simultaneously accessed when the main cell MC within the sub cell array sub_T is accessed.

The column selector CS selectively activates a corresponding column bitline using a Y(column) address.

If the column selector CS is in high level, the corresponding column bitline is connected to a data bus, so as to enable data transmission.

Figure 7:
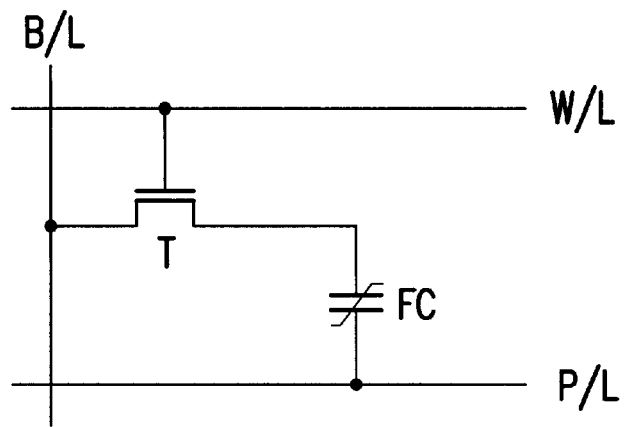
FIG. 7 is a circuit diagram of a unit main cell of FIG. 6.

The main cell MC is constructed as shown in FIG. 7. As shown, a bitline B/L is formed in one direction, and a wordline W/L is formed to cross the bitline B/L. A plate line P/L is spaced apart from the wordline W/L in the same direction as the wordline W/L. A transistor T, with a gate connected with the wordline W/L and a source connected with the bitline B/L, is formed. A ferroelectric capacitor FC is formed in such a manner that its first terminal is connected with a drain of the transistor T and its second terminal is connected with the plate line P/L.

Figure 8:
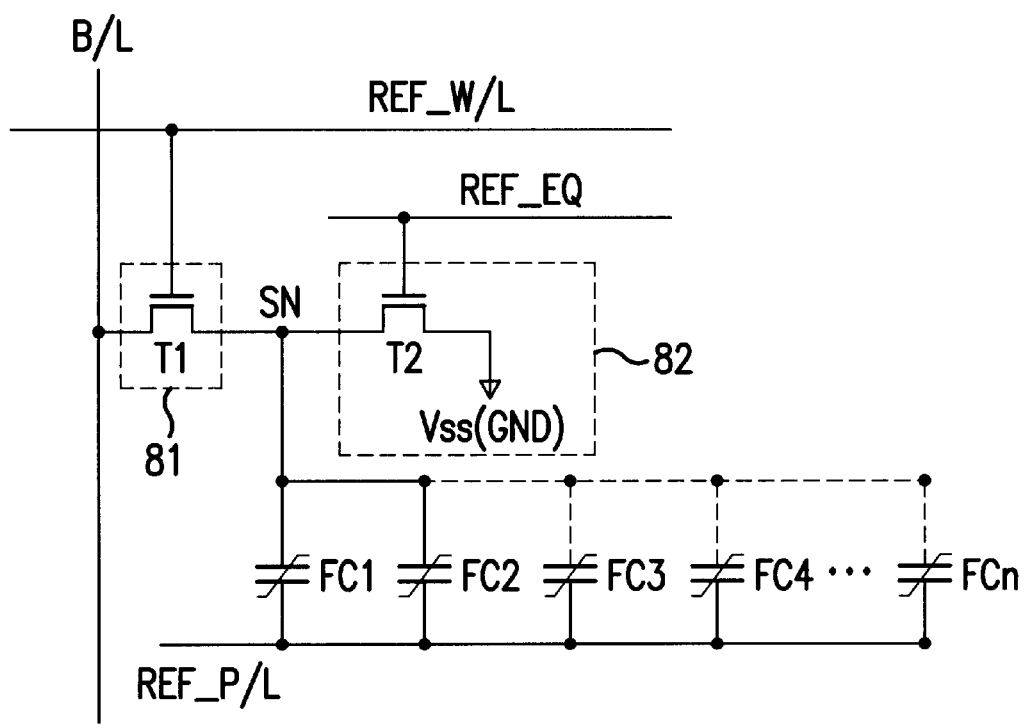
FIG. 8 is a circuit diagram of a reference cell of FIG. 6.

FIG. 8 is a detailed schematic view of the reference cell RC of the nonvolatile ferroelectric memory device according to an embodiment of the present invention. As shown in FIG. 8, the reference cell RC of the nonvolatile ferroelectric memory device includes a bitline B/L formed in one direction, a reference wordline REF_W/L formed across the bitline, a switching block 81, a level initiating block 82, and a plurality of ferroelectric capacitors FC1, FC2, FC3, FC4, . . . , FCn. The switching block 81 is controlled by a signal of the reference wordline REF_W/L to selectively transmit a reference voltage stored in the ferroelectric capacitors to the bitline B/L. The level initiating block 82 selectively initiates a level of an input terminal of the switching block 81 connected to the ferroelectric capacitors. The ferroelectric capacitors are connected to the input terminal of the switching block 81 in parallel.

The switching block 81 includes an NMOS transistor (hereinafter, "first transistor") T1 with a gate connected to the reference wordline REF_W/L, a drain connected to the bitline B/L, and a source connected to a storage node SN.

The level initiating block 82 is controlled by a reference cell equalizer control signal REF_EQ, which is a control signal for initiating the storage node SN of the reference cell RC. Also, the level initiating block 82 includes an NMOS transistor (hereinafter, "second transistor") T2 connected between the source of the first transistor T1 and a ground terminal Vss.

The ferroelectric capacitors FC1, FC2, FC3, FC4, . . . , FCn include a first electrode, a second electrode, and a ferroelectric material formed between first and second electrodes. The first electrode of each ferroelectric capacitor is connected to the source of the first transistor T1, and its second electrode is connected to the reference plate line REF_P/L.

The number of the ferroelectric capacitors FC1, FC2, FC3, FC4, . . . , FCn is determined depending on the desired capacitor size of the reference cell. That is, the number of the ferroelectric capacitors can freely be adjusted depending on the capacitor size of the reference cell.

The storage node SN is connected with first terminals of the ferroelectric capacitors FC1, FC2, FC3, FC4, . . . , FCn in parallel.

The reference cell equalizer control signal REF_EQ initiates the storage node SN to a ground voltage level. Namely, if the reference cell equalizer control signal REF_EQ is in high level, the second transistor T2 is turned on so that the storage node SN is maintained at a ground voltage level.

Figure 1:
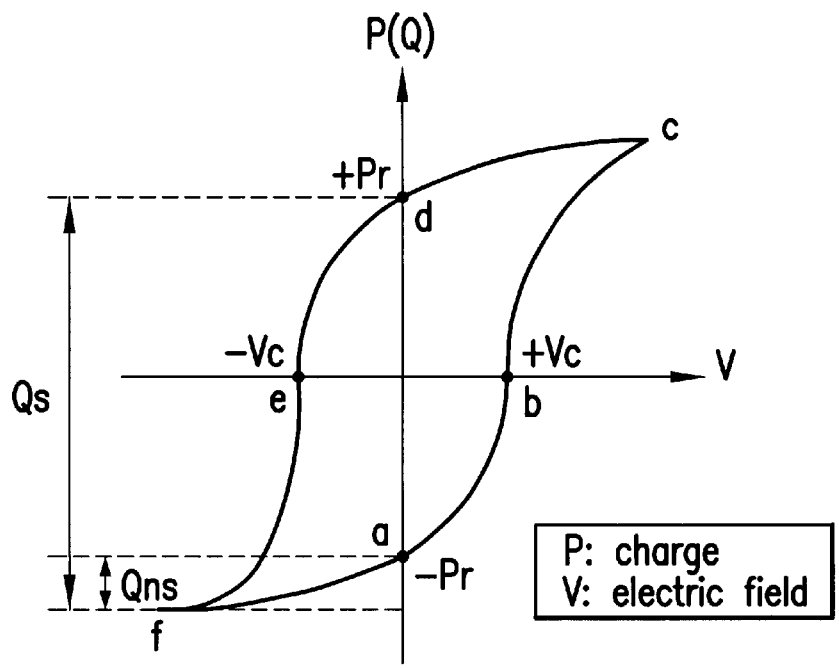
FIG. 1 shows hysteresis loop of a general ferroelectric.
Figure 2:
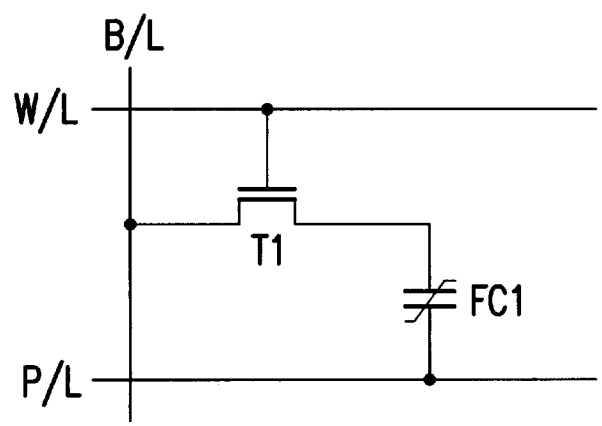
FIG. 2 is a schematic view of a unit cell of a related art nonvolatile ferroelectric memory.
Figure 3:
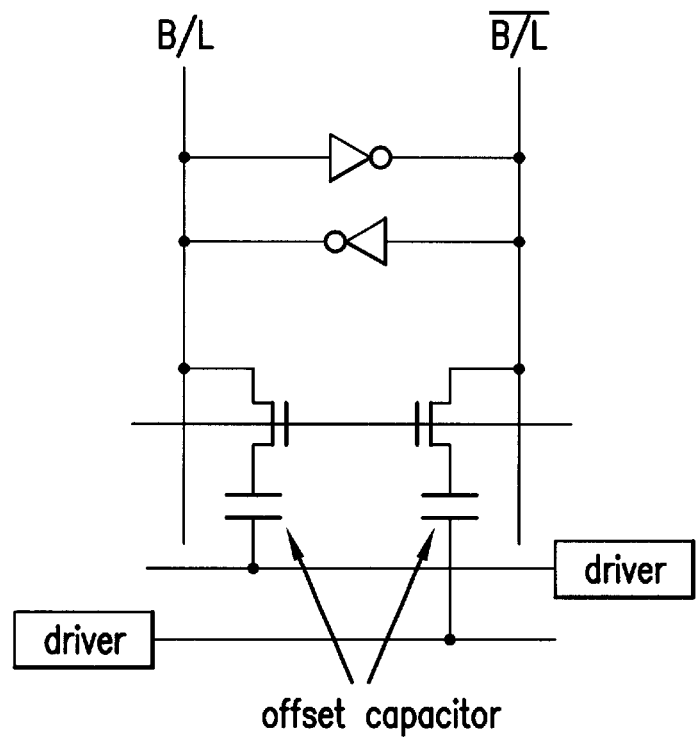
FIG. 3 is a diagram of an offset control circuit of a related art sensing amplifier.
Figure 4:
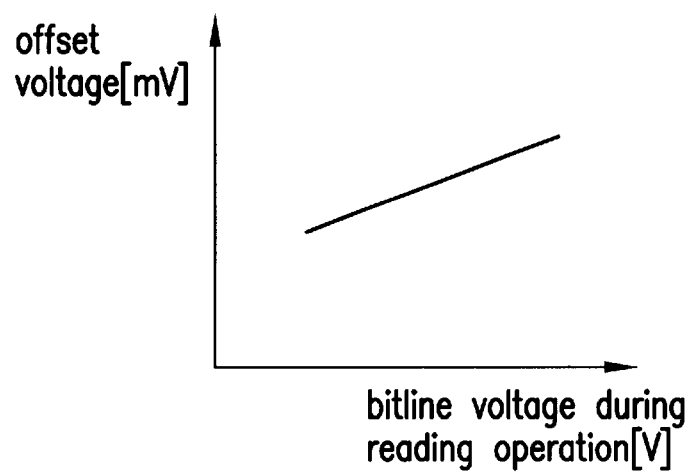
FIG. 4 is a graph showing variation of an offset voltage according to a bitline voltage during related art reading operation.

The operation of the aforementioned reference cell will now be described. Qs and Qns of the hysteresis loop in FIG. 1 denote switching charges of the ferroelectric capacitor and non-switching charges of the ferroelectric capacitor, respectively. The reference cell of the present invention is based on Qns. That is to say, the reference wordline REF_W/L within the operation cycle is transited to high level together with the reference plate line REF_P/L. Accordingly, charges equivalent to the size of Qns of the ferroelectric capacitor are supplied to the bitline B/L.

Then, the reference wordline REF_W/L is transited to low level before the sensing amplifier is operated, so that the reference cell is not affected by a voltage of the bitline B/L.

Meanwhile, the reference plate line REF_P/L is maintained at high level, and is transited to low level when the reference wordline REF_W/L is sufficiently stabilized.

As described above, since non-switching charges Qns are used, a separate restoring operation is not required during a precharge period. Accordingly, high level is not required any longer in the reference wordline REF_W/L.

Since the reference level is affected by an initial level of the storage node SN, the second transistor T2 of FIG. 8 is used to stabilize the storage node SN, and the reference equalizer control signal REF_EQ is used to initiate the storage node SN to the ground voltage level. Therefore, since the initial level of the storage node SN is maintained at the ground voltage level, the reference level can be stabilized.

Reading and writing operations of the nonvolatile ferroelectric memory device according to the present invention will now be described.

Figure 9:
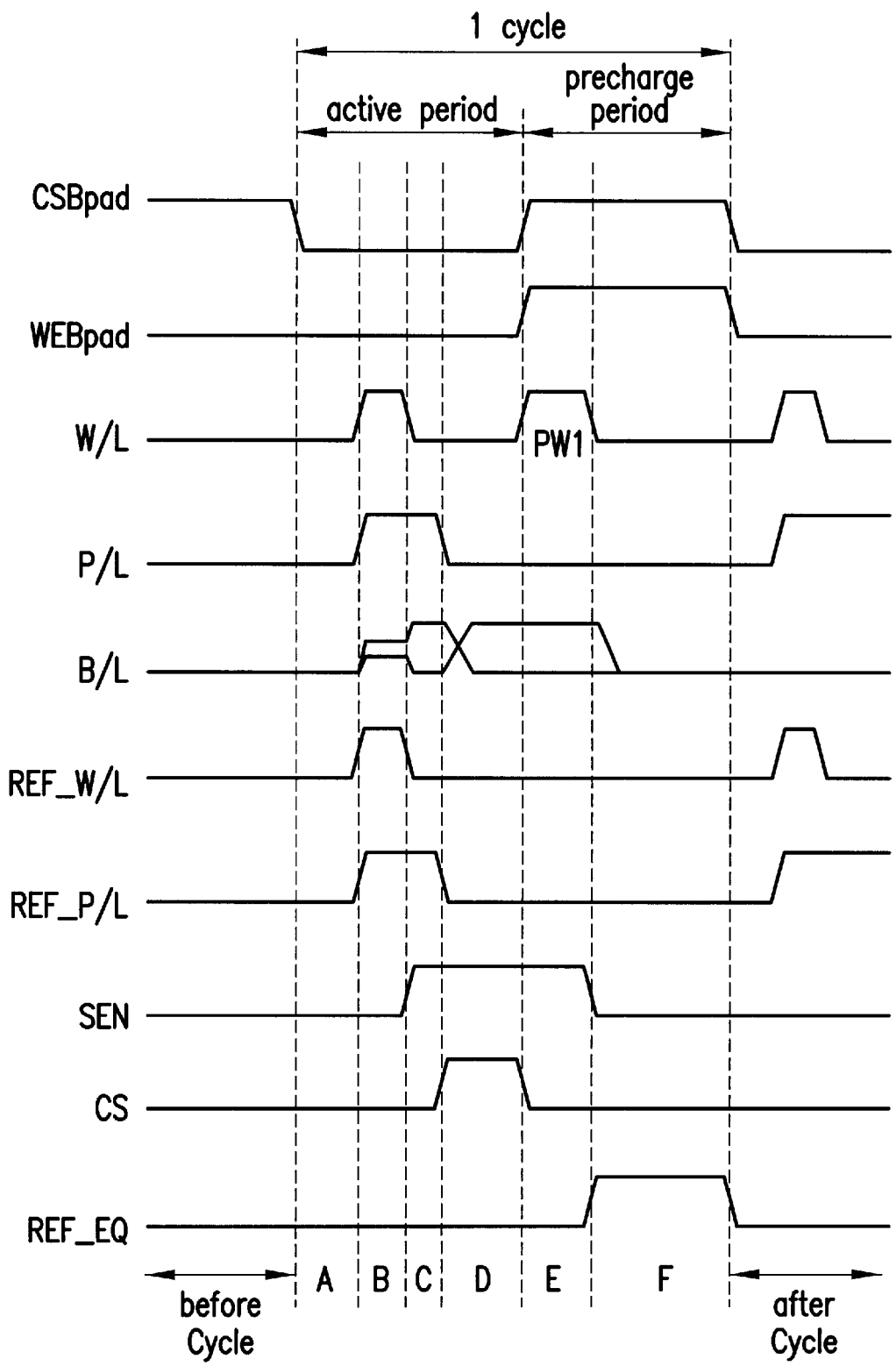
FIG. 9 is a timing chart showing the operation of a write mode according to an embodiment of the nonvolatile ferroelectric memory device of the present invention.
Figure 10:
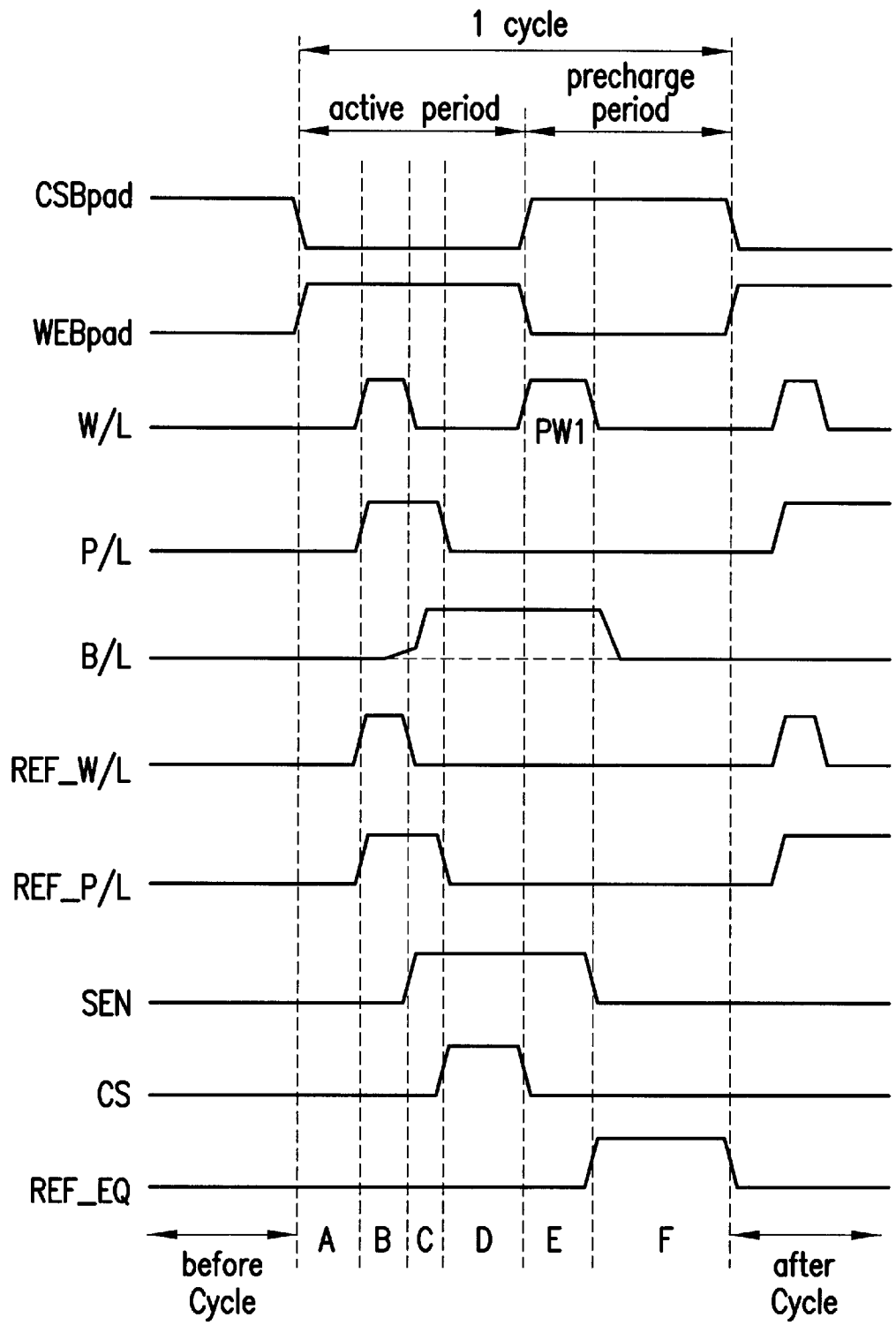
FIG. 10 is a timing chart showing the operation of a read mode according to an embodiment of the nonvolatile ferroelectric memory device of the present invention.

FIG. 9 is a timing chart showing the operation of a write mode according to the nonvolatile ferroelectric memory device of the present invention, and FIG. 10 is a timing chart showing the operation of a read mode according to the nonvolatile ferroelectric memory device of the present invention.

The write mode and read mode differ from each other in the direction of the transmission of data. Referring to FIG. 9, external data is forcibly input to the bitline B/L through a data input pad when the writing operation is performed by a write enable signal WEBpad. During the read operation, referring to FIG. 10, data amplified by the sensing amplifier is transmitted to an external data input/output pad.

With reference to the waveforms of FIG. 9, the data writing operation will be described.

One cycle is completed in such a manner that an external chip enable signal CSBpad is transited to low level to start an active period and then a precharge period advances.

If an active period of a chip starts at the beginning of period A, then address decoding starts during a period A. A corresponding wordline W/L, a corresponding plate line P/L, a corresponding reference wordline REF_W/L, and a corresponding reference plate line REF_P/L are activated at high levels as various control signals are activated.

During period B, the wordline W/L and the reference wordline REF_W/L are maintained at a high level, so that the data of the main cell MC and the data of the reference cell RC are respectively transmitted to their bitlines B/L. Also, the main cell has a logic value of "0" and is amplified in period C.

For reference, the bitline B/L to which the data of the main cell MC is transmitted is not the same as the bitline B/L to which the data of the reference cell RC is transmitted. Namely, as described above, among sub cell arrays, the main cell MC within the sub cell array at the top portion of the sensing amplifier is operated together with the reference cell within the sub cell array at the bottom portion of the sensing amplifier. Accordingly, the data of the main cell is transmitted to the bitline within the sub cell array at the top portion while the data of the reference cell is transmitted to the bitline within the sub cell array at the bottom portion.

When the data of the main cell and the data of the reference cell are sufficiently transmitted to their corresponding bitline, the wordline W/L and the reference wordline REF_W/L are transited to low level so that the bitline B/L is separated from the cell.

Therefore, bitline loading due to the difference of the capacitor size between the main cell and the reference cell can be removed. This improves a sensing margin of the sensing amplifier.

When the wordline W/L and the reference wordline REF_W/L are transited to low level, a sensing amplifier enable signal SEN of the sensing amplifier is activated at high level during a period C. Thus, the data of the bitline is (referring to the bitline of the MC and the bitline of the reference cell RC) is amplified.

At this time, the plate line P/L and the reference wordline REF_W/L are maintained at high level and then transited low level when a period D starts. A high pulse of column selector CS is received in period D so that the external data of the bitline B/L is sent to the data bus DB.

In period E, W/L is high while P/L remains low, so that data having a logic value of "1" is written in the main cell MC.

Finally, it is noted that the plate line P/L and reference plate line REF_P/L are not transited when the wordline W/L and the reference wordline REF_W/L are transited. Accordingly, interference noise that may occur due to simultaneous transition of the plate line P/L and the wordline W/L or the reference wordline REF_W/L and the reference plate line REF_P/L can be avoided.

Afterwards, the amplification operation of the sensing amplifier proceeds to a stable mode.

The operation of the read mode will now be described with reference FIG. 10.

In the read mode, the data of the bitline is transmitted to the data bus. The read mode operations is implemented with timing such as the timing of the write mode. Data of the cell in the period B has a logic value of "0" and is amplified in period C. Column selector CS is activated to a high level period D. At this time, the data of the main cell MC is output to the sensing amplifier S/A and the previous data having a logic value of "1" is restored in the main cell MC during period E.

In other words, a precharge period starts if the external chip enable signal CSBpad is transited to high level. Then, the wordline W/L is only transited from low level to high level during a period E. At this time, since the sensing amplifier enable signal SEN is continuously maintained at high level to activate the sensing amplifier, the bitline B/L continuously maintains amplified data or reprogrammed data.

Accordingly, the data of the main cell having a logic value "1", destroyed during the period B, is restored. This is called a restoring operation.

If the restoring operation is completed, the bitline B/L and the storage node SN of the reference cell RC are initiated at the ground voltage level during the period F, to start the next cycle.

Next, the pulse generator 56 for detecting a weak cell using a variable charge amount stored in the ferroelectric capacitor of the main cell MC depending on the size of the restore pulse width PW1 during the read mode will be described.

As shown in FIG. 5, the pulse generator 56 includes a switching signal generating unit 54, which includes a first switching signal generator 52 and a second switching signal generator 53, and a pulse width variable controller 55 for selectively receiving signals SWC1 and SWC2 output from the first and second switching signal generators 52 and 53 and for varying the pulse PW1.

Figure 11:
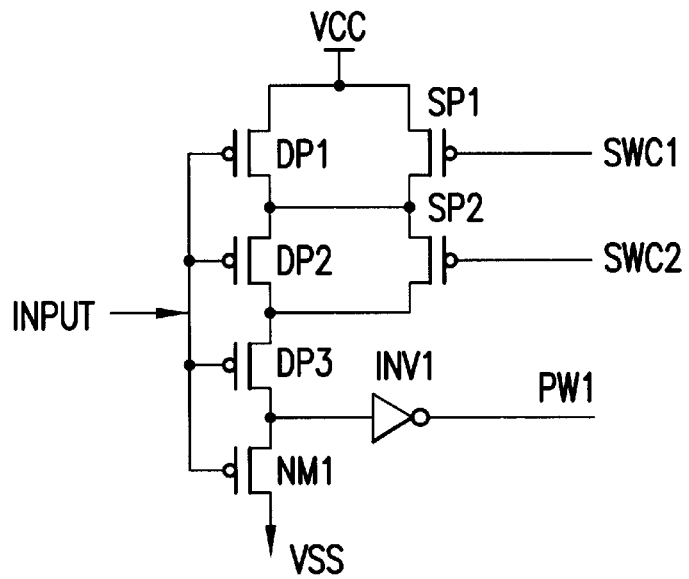
FIG. 11 is a circuit diagram of the pulse width variable controller in FIG. 5.

As shown in FIG. 11, the pulse width variable controller 55 includes first, second and third PMOS transistors DP1, DP2 and DP3 and a first NMOS transistor NM1 connected in series. An input signal INPUT is input to the gates of the first-third PMOS transistors DP1–DP3 and the first NMOS transistor NM1. The first, second and third PMOS transistors DP1, DP2 and DP3 and the first NMOS transistor NM1 are connected in series between a power source voltage terminal VCC and a ground voltage terminal VSS. Fourth and fifth PMOS transistors SP1 and SP2 are respectively connected with the first PMOS transistor DP1 and the second PMOS transistor DP2 in parallel, and are driven by the first and second switching signals SWC1 and SWC2 for varying the pulse width. The pulse width variable controller 55 further includes a first inverter INV1 for inverting a signal of a common node of the third PMOS transistor DP3 and the first NMOS transistor NM1 to output the restore pulse PW1.

The width of the restore pulse PW1 output from the pulse width variable controller 55 is determined depending on the first and second switching signals SWC1 and SWC2.

The first and second switching signal generators 52 and 53 for generating the first and second switching signals SWC1 and SWC2 will now be described.

Figure 12:
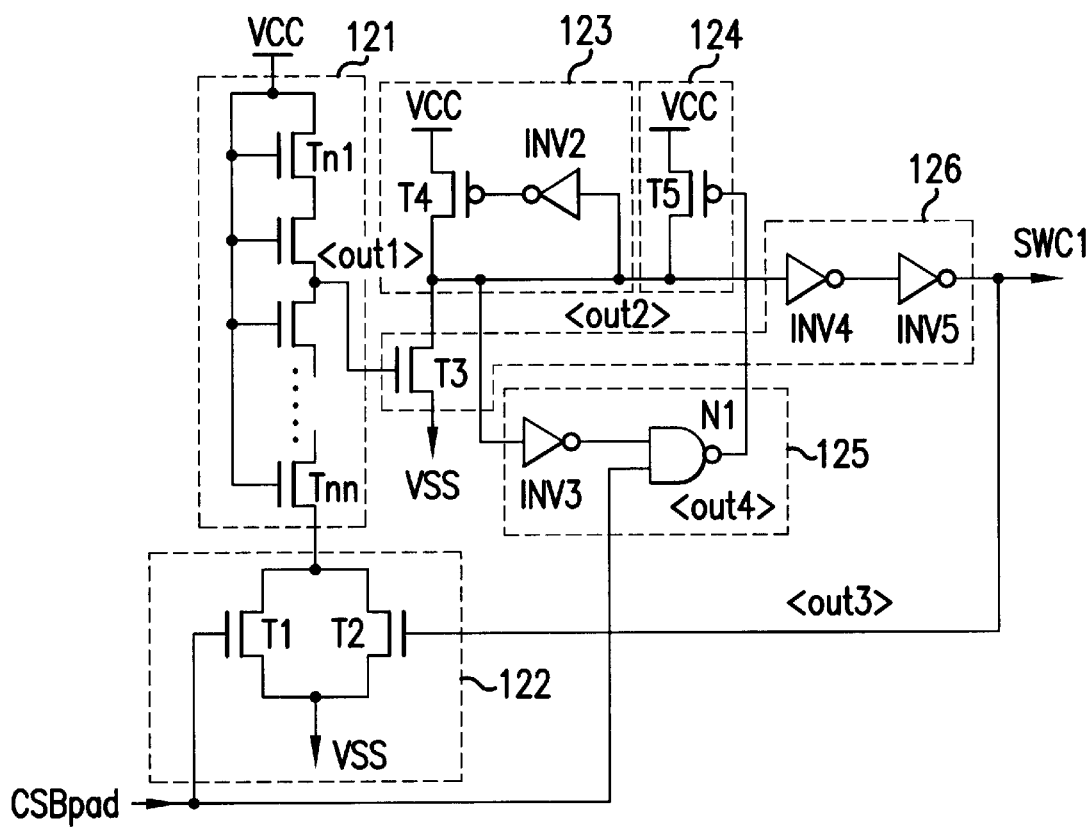
FIG. 12 is a circuit diagram of the first switching signal generator in FIG. 5.
Figure 13:
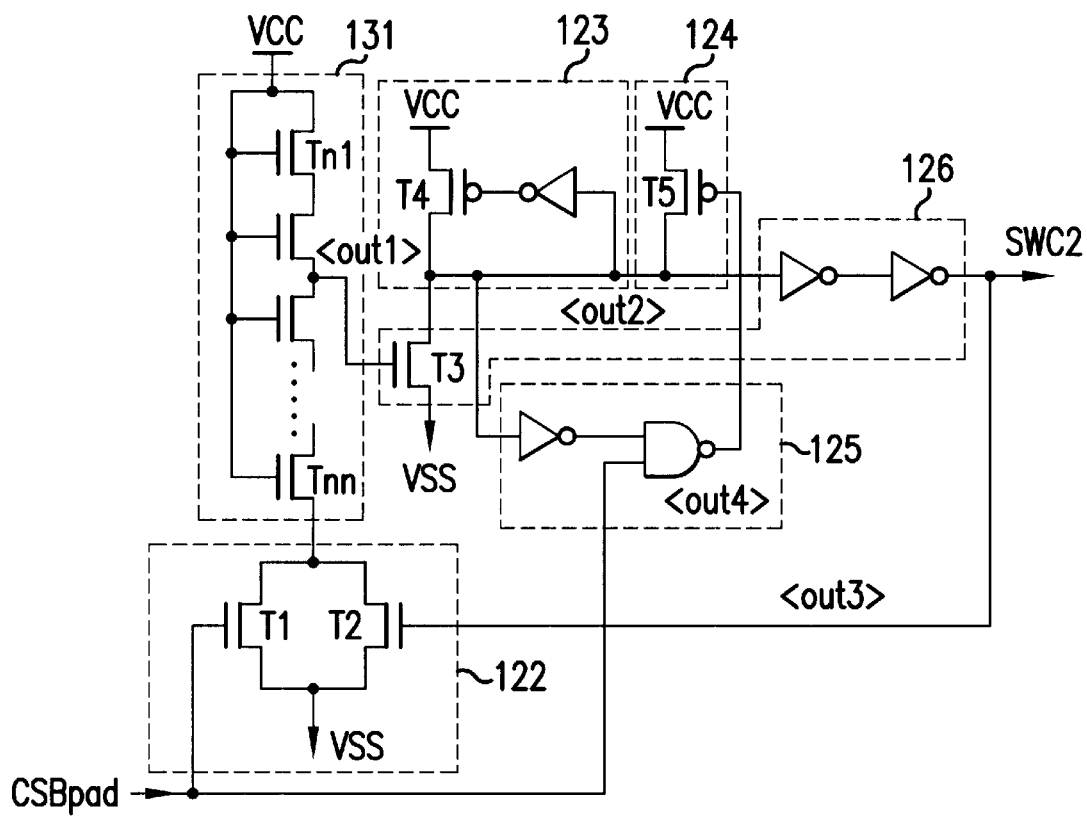
FIG. 13 is a circuit diagram of the second switching signal generator in FIG. 5.

FIG. 12 is a circuit diagram of the first switching signal generator of FIG. 5, and FIG. 13 is a circuit diagram of the second switching signal generator of FIG. 5.

First, as shown in FIG. 12, the first switching signal generator 52 includes a system power voltage sensitive divider 121, a signal synchronizing unit 122, a level maintaining unit 123, a current supplying unit 124, a control unit 125, and a high voltage determining unit 126.

The system power voltage sensitive divider 121 includes a plurality of NMOS transistors Tn1–Tnn connected in series. Each of the NMOS transistors Tn1~Tnn has a gate to which the power source voltage VCC is applied. The system power voltage sensitive divider 121 supplies the system power at a constant ratio to output a power voltage variation value to a first output terminal out1 (the node between second and third NMOS transistors Tn2 and Tn3).

The signal synchronizing unit 122 synchronizes an output variation of the system power voltage sensitive divider 121 with a chip enable signal CE and the output first switching signal SWC1. The signal synchronizing unit 122 includes two NMOS transistors T1 and T2 connected in parallel between a source terminal of the last NMOS transistor Tnn of the divider 121 and the ground voltage terminal VSS. The chip enable signal CE and the first switching signal SWC1 are respectively connected to the first and second NMOS transistors T1 and T2, and pull the first output terminal out1 to ground when either of the chip enable signal CE or the first switching signal SWC1 is high.

Figure 17:
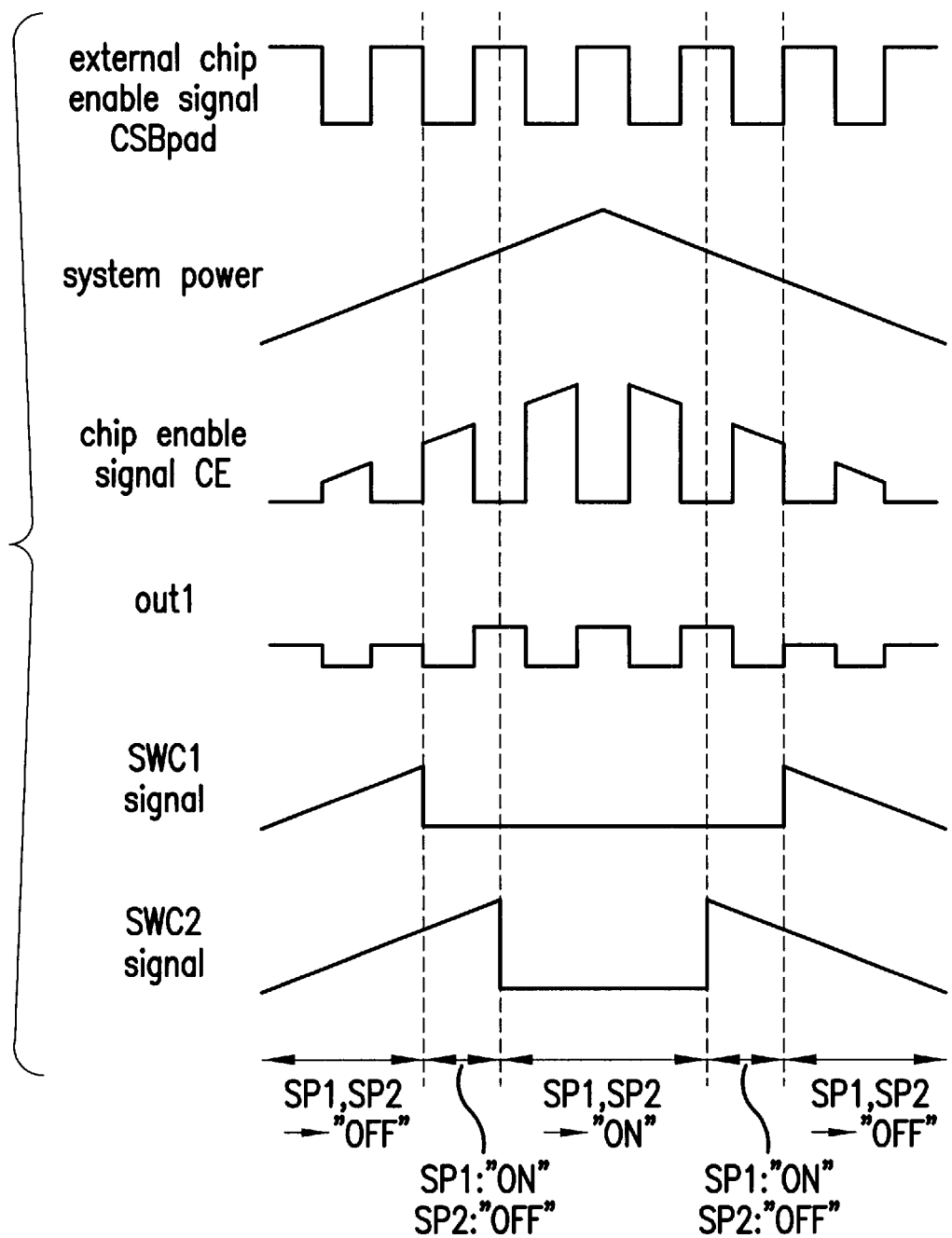
FIG. 17 is a schematic view illustrating the operation of a high voltage sensing synchronizing circuit in FIG. 5.

As shown in FIG. 17, the divider 121 outputs a lower output signal to the first output terminal out1 in a state that the external chip enable signal CSBpad is activated and the divider 121 outputs a higher output signal to the first output terminal out1 in a state that the external chip enable signal CSBpad is deactivated.

The level maintaining unit 123 includes a PMOS transistor T4, connected between the power source voltage terminal VCC and the drain terminal of an NMOS transistor T3, and an inverter INV2 for inverting a signal of a source terminal of the PMOS transistor T4 (referred to as the second output terminal out2) and inputting it to the gate terminal of the PMOS transistor T4.

The level maintaining unit 123 maintains a high level only when the second output terminal out2 of a drain terminal of the NMOS transistor T3, switched depending on the output signal of the first output terminal out1 of the system power sensitive divider 121, is in the high level (i.e., first output terminal out1 is low and the NMOS transistor T3 does not pull the second output terminal to VCC). The level maintaining unit 123 is not operated if the output signal of the second output terminal out2 is in low level.

The current supplying unit 124 includes a PMOS transistor T5 connected between the power source voltage terminal VCC and the second output terminal out2. The current supplying unit 124 acts to supply current to the drain terminal of the NMOS transistor T3, and maintains the output signal of the second output terminal out2 at high level in a normal voltage state.

The control unit 125 acts to control the current supplying unit 124, and includes an inverter INV3 for inverting a signal of the source terminal of the PMOS transistor T4 and a NAND gate NI for performing logic AND operation of the chip enable signal CE and the signal of the inverter INV3 and inverting the resultant value. The output of the NAND gate N1 serves as the fourth output terminal out4, which is connected to the gate of the PMOS transistor T5 and controls the operation thereof.

An output signal of a fourth output terminal out4, the output of the NAND gate N1, will be at a low level when the output signal of the second output terminal out2 is at a low level and the chip enable signal CE is at a high level. This activates the PMOS transistor T5 of the current supplying unit 124 to supply current to the second output terminal out2.

The output signal of the second output terminal out2 can be sufficiently maintained in a normal voltage state even when current is supplied to the second output terminal out2. When in a low voltage region, the output signal of the second output terminal out2 is boosted at high level to output high data to the third output terminal out3. Accordingly, a high voltage state is detected when the switching signal SWC1 is in low level.

The high voltage determining unit 126 detects a power source voltage to determine a high voltage and a normal voltage. The output signal of the output terminal out2 is in high level in a normal voltage region while the output signal of the output terminal out2 is in low level in a high voltage region. The normal voltage region exists when SP1 and SP2 are turned off and as shown in FIG. 17, and is when SWC1 and SWC2 become high. The high voltage regions occurs when either SP1 or SP2 is turned on as either SWC1 or SWC2 becomes low, as shown in FIG. 17.

The high voltage determining unit 126 includes an NMOS transistor T3 and two inverters INV4 and INV5. The NMOS transistor T3 is connected between the source terminal of the PMOS transistor T4 and the ground voltage terminal VSS, and its level is determined in response to variation of the output signal of the first output terminal out1 of the system power sensitive divider 121. The two inverters INV4 and INV5 are serially connected with each other to delay the signal of the drain terminal of the NMOS transistor T3.

As shown in FIG. 13, the switching signal generator 53 has the same structure as the first switching signal generator 52 except that the divider 121 has been replaced with a system power voltage divider 131. The system power voltage divider 131 is similar to the system power voltage divider 121 and includes a plurality of NMOS transistors Tn1–Tnn. However, the first and second NMOS transistors Tn1 and Tn2 are connected to the power source voltage terminal Vcc by a diode connector while the other NMOS transistors Tn3–Tnn are connected to one another in series having a gate to which the power source voltage is applied.

The aforementioned switching signal generators 52 and 53 control the fourth and fifth PMOS transistors SP1 and SP2 (see FIG. 11) of the pulse width variable controller 55 so as to generate the first and second switching signals SWC1 and SWC2 for controlling the pulse width PW1.

As shown in FIGS. 11 and 17, when the system power voltage is normal, switching signals SWC1 and SWC2 are in high level so the fourth and fifth PMOS transistors SP1 and SP2 are turned off. When the system power is high, switching signals SWC1 and SWC2 are in a low level so that SP1 and SP2 are turned on. Also, the system power voltage at the point that switching signal SWC1 is transmitted to a low level is lower than the system power voltage when switching signal SWC2 is transmitted to low level. As a result, when switching signal SWC1 is in a low level and switching signal SWC2 is in a higher level, SP1 is on while SP2 is off.

The operation of the pulse width variable controller 55, based on the switching signals SWC1 and SWC2 output through the aforementioned first and second switching signal generators 52 and 53, will now be described.

Figure 18A:
FIGS. 18($a$)–18($d$) illustrate the pulse widths PW1 according to signal waveforms SWC1 and SWC2 of FIG. 17.
Figure 18B:
Figure 18C:
Figure 18D:

As shown in FIGS. 11, 17 and 18a–d, when a waveform of the input signal INPUT is as shown in FIG. 18d and the first and second switching signals SWC1 and SWC2 are all in low level as shown in FIG. 17, then the voltage VCC is transferred by the third and fourth PMOS transistors SP1 and SP2 and is only delayed by the third PMOS transistor DP3 because the fourth and fifth PMOS transistors SP1 and SP2 are turned on. The pulse width PW1 is as shown in FIG. 18b.

In FIG. 18a, INPUT refers to a signal width a pulse with PW1 before the delay occurs.

When the input signal INPUT is as shown in FIG. 18a, the first switching signal SWC1 is in low level and the second switching signal SWC2 is in high level, the voltage VCC is only delayed by the second and third PMOS transistor DP2 and DP3 because the fourth PMOS transistor SP1 is turned on while the fifth PMOS transistor SP2 is turned off. The pulse width PW1 as shown in FIG. 18c is thus obtained.

If either the fourth PMOS transistor SP1 or the fifth PMOS transistor SP2 is turned on, the voltage VCC is delayed by two PMOS transistors only. Accordingly, the pulse width PW1 as shown FIG. 18c, which is greater than that of FIG. 18b, is obtained.

When the input signal INPUT is as shown in FIG. 18a, and the first and second switching signals SWC1 and SWC2 are all in high level, the voltage VCC is delayed by the first to third PMOS transistor DP1 to DP3 because the fourth and fifth PMOS transistors SP1 and SP2 are turned off. Thus, pulse width PW1 as shown in FIG. 18d, which is greater than that of FIG. 18c, is obtained.

Also, as shown in FIGS. 11 and 18, NM1 has a relatively large size so delay factors do not occur and pulses are generated simultaneously. The delay operation is only implemented by DP1, DP2, DP3, SP1, and SP2., which have relatively great delay factors. Also, the delay is realized at the end of the pulse because the pulses are generated at the same point.

INPUT(pre-PW1) refers to a pulse generated in period E and is generated through a separate circuit different than the circuit generating the W/L pulse in period B.

The method for detecting the aforementioned nonvolatile ferroelectric memory device will now be described.

Figure 14:
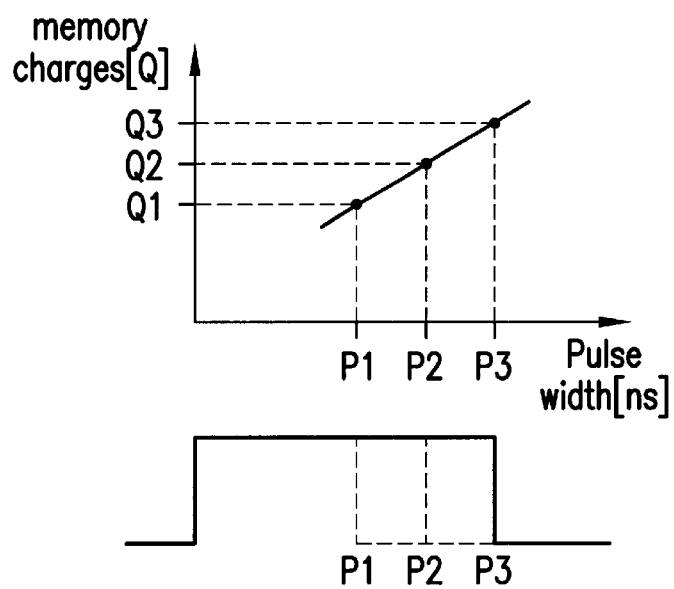
FIG. 14 is a graph showing dependancy of memory charges according to the size of the pulse width PW1.
Figure 15A:
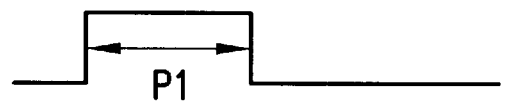
FIGS. 15($a$)–15($c$) show various examples of the pulse width PW1.
Figure 15B:
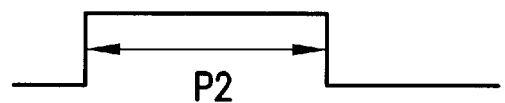
Figure 15C:
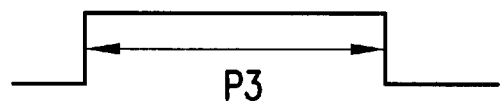
Figure 16:
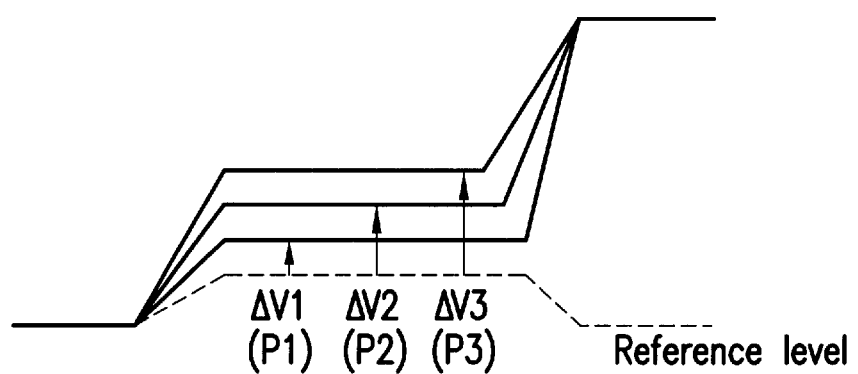
FIG. 16 shows dependancy of a voltage induced to a bitline B/L according to variation of the pulse width PW1 in FIG. 15.

FIG. 14 is a graph showing dependency of memory charges according to the size of the pulse width PW1, FIGS. 15(a)–15(c) show various examples of the pulse width PW1, and FIG. 16 shows dependency of a voltage induced to a bitline B/L according to variation of the pulse width PW1 in FIGS. 15(a)–15(c).

In the present invention, to ensure reliability of the nonvolatile memory chip, a weak cell is removed in advance.

A nonvolatile ferroelectric memory cell driver includes a sensing amplifier S/A arranged between adjacent top and bottom sub cell arrays sub_T and sub_B to sense the top and bottom sub cell arrays, and a wordline driver 57 for driving the wordlines of the top and bottom sub cell arrays. The method for detecting a weak cell using the aforementioned nonvolatile ferroelectric memory cell driver includes the steps of selectively outputting a wordline decoding signal from the X-decoder to the wordline driver 57, varying a width of the restore pulse PW1 and outputting the varied width to the wordline driver 57 to detect the weak cell of the top and bottom cell arrays, controlling data (charge amount)

to be stored in a memory cell of each cell array simultaneously with the output of the restore pulse PW1, varying bitline sensing levels corresponding to the controlled data, and sensing data of a memory cell of each cell array to detect a memory cell first reached a minimum sensing level among the varied bitline sensing levels, thereby determining a weak cell.

In other words, the restore pulse width is varied during reading operation of the memory cell, so that charge amount (data value) stored in the ferroelectric capacitor of the memory cell is controlled. The bitline sensing levels are varied to correspond to the controlled charge amount (data value). A memory cell having a bitline voltage less than a minimum sensing level, which is the voltage on the reference bitline from the reference cell, is determined as a weak cell and then eliminated.

The weak cell detection is implemented for all cells by sequentially inputting address signals through a wordline driver. If the bitline sensing level output through the sensing amplifier S/A is less than a minimum sensing level, a weak cell is detected.

The minimum sensing level corresponds to the minimum voltage for operating the sensing amplifier S/A. For example, supposing that $\Delta V2$ in FIG. 16 is a sensing level, $\Delta V2$ is compared with the reference level, as shown on FIG. 16. Then, a memory cell showing $\Delta V1$ which is less than $\Delta V2$ is determined to be a weak memory, cell, and a cell showing $\Delta V3$ is determined to be a normal cell.

FIG. 14 shows dependancy of charges according to the size of the pulse width PW1 in the read and write modes of the nonvoatile ferroelectric memory cell. Referring to FIG. 14, charges of the data having a logic value "1" are varied in such a way as Q1<Q2<Q3 when the size of the restore pulse PW1 is P1<P2<P3. At this time, P1, P2 and P3 are controlled by the first and second switching signal generators 52 and 53 and the pulse width variable controller 55.

FIGS. 15(a)–15(c) and 16 show variation of the pulse width PW1 and variation of a voltage induced in the bitline B/L during the read mode. Referring to FIGS. 15(a)–15(c) and 16, if the pulse width PW1 is varied in such a way as P1<P2<P3, the data stored in the cell are also varied. Accordingly, the bitline level is varied in such a way as V1<V2<V3.

As described above, the restore pulse width PW1 is varied to control the data stored in the cell, so that the bitline sensing level is varied. Thus, if a voltage less than a reference bitline voltage is sensed, the cell is determined as a weak cell.

At this time, the restore pulse PW1 may optionally be varied by a user.

In other words, the pulse width PW1 is varied depending on the switching signals SWC1 and SWC2 output from the first and second switching signal generators 52 and 53. The varied pulse width is output to each cell array through the wordline driver 57, so that the data stored in each cell is controlled. After the bitline sensing level is determined by the sensing amplifier S/A, a cell having a bitline voltage less than the reference bitline voltage is detected as a weak cell and then eliminated.

As aforementioned, the nonvolatile ferroelectric memory device and method for detecting a weak cell using the same according to the present invention has the following advantages.

First, since the power source voltage detecting circuit (first and second switching signal generators) is provided, the weak cell can be determined and eliminated without a separate test mode. In addition, since the size of the restore pulse is varied to control the data stored in the memory cell, the weak cell can easily be determined and eliminated even if the process conditions are varied.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile ferroelectric memory device, comprising:
   a nonvolatile ferroelectric memory cell driver including a top cell array and a bottom cell array, a sensing amplifier formed between the top and bottom cell arrays, for sensing the top and bottom cell arrays, and a wordline driver for driving a wordline of the top and bottom cell arrays;
   an X-decoder for selectively outputting a wordline decoding signal to the wordline driver; and
   a pulse width generating unit for varying a width of a restore pulse and outputting the varied width to the wordline driver to detect a weak cell of the top and bottom cell arrays.

2. The nonvolatile ferroelectric memory device of claim 1, wherein the top and bottom cell arrays include a reference cell provided in one bitline and a plurality of main cells driven by a bitline signal equal to the reference cell.

3. The nonvolatile ferroelectric memory device of claim 1, wherein the pulse width generating unit includes
   first and second switching signal generators for outputting switching control signals to vary the restore pulse width, and
   a pulse width variable controller for selectively receiving the switching control signals of the first and second switching signal generators to vary the restore pulse.

4. The nonvolatile ferroelectric memory device of claim 3, wherein the first switching signal generator includes:
   a system power voltage sensitive divider for descending system power at a constant ratio to output a power voltage variation through a first node;
   a signal synchronizing unit for synchronizing an output variation of the system power voltage sensitive divider with an external chip enable signal;
   a level maintaining unit for maintaining a relatively high level state when a second node of a transistor switched by the first node is in a relatively high level;
   a current supplying unit for supplying current to the second node to maintain the second node at a relatively high level in a normal voltage state;
   a control unit for controlling the current supplying unit in response to the second node and the external chip enable signal; and
   a high voltage determining unit for detecting a level of the second node to determine a relatively high voltage and a normal voltage.

5. The nonvolatile ferroelectric memory device of claim 4, wherein the system power voltage sensitive divider includes
   a plurality of NMOS transistors connected in series,
   a drain terminal of the first NMOS transistor being connected to a power source voltage terminal, and
   a power source voltage being applied to each gate of the NMOS transistors.

6. The nonvolatile ferroelectric memory device of claim 4, wherein
the signal synchronizing unit receives a chip enable signal and an output signal of the high voltage determining unit, and
the synchronizing unit includes two NMOS transistors connected in parallel between the system power voltage sensitive divider and a ground voltage terminal.

7. The nonvolatile ferroelectric memory device of claim 4, wherein the level maintaining unit includes
a PMOS transistor formed between a power source voltage terminal and the second node, and
an inverter for inverting a signal of the second node and inputting it to the PMOS transistor.

8. The nonvolatile ferroelectric memory device of claim 4, wherein the current supplying units includes
a PMOS transistor connected between a power source voltage terminal and the second node and switched under the control of the control unit.

9. The nonvolatile ferroelectric memory device of claim 4, wherein the control unit includes
an inverter for inverting a signal of the second node, and
a NAND gate for performing logic AND operation of the chip enable signal and the signal of the inverter and inverting the resultant value.

10. The nonvolatile ferroelectric memory device of claim 4, wherein the high voltage determining unit includes two inverters connected in series to delay the signal of the second node.

11. The nonvolatile ferroelectric memory device of claim 3, wherein the second switching signal generator includes:
a system power voltage sensitive divider for descending system power at a constant ratio greater than the system power of the first switching signal generator to output a power voltage variation through a first node;
a signal synchronizing unit for synchronizing an output variation of the system power voltage sensitive divider with the external chip enable signal;
a level maintaining unit for maintaining a relatively high level state when a second node of a transistor switched by the first node is in a relatively high level;
a current supplying unit for supplying current to the second node to maintain the second node at relatively high level in a normal voltage state;
a control unit for controlling the current supplying unit in response to the second node and the external chip enable signal; and
a high voltage determining unit for detecting a level of the second node to determine a relatively high voltage and a normal voltage.

12. The nonvolatile ferroelectric memory device of claim 11, wherein the system power voltage sensitive divider includes
a plurality of NMOS transistors,
a drain terminal of the first NMOS transistor being connected to a power source voltage terminal, and
the first and second NMOS transistors being connected to each other in series by a diode.

13. The nonvolatile ferroelectric memory device of claim 3, wherein the pulse width variable controller includes
first, second and third PMOS transistors DP1, DP2 and DP3 and a first NMOS transistor NM1 to which an input signal INPUT for delay is commonly input, and
the first, second and third PMOS transistors DP1, DP2 and DP3 and the first NMOS transistor NM1 being in parallel connected between a power source voltage terminal and a ground voltage terminal;
fourth and fifth PMOS transistors SP1 and SP2 respectively connected with the first PMOS transistor DP1 and the second PMOS transistor DP2 in parallel and driven by first and second switching signals SWC1 and SWC2 for varying the pulse width; and
an inverter for inverting a signal of a common node of the third PMOS transistor DP3 and the first NMOS transistor NM1 to output the restore pulse PW1.

14. A method for detecting a weak cell using a nonvolatile ferroelectric memory device having a nonvolatile ferroelectric memory cell driver including a top cell array and a bottom cell array, a sensing amplifier for sensing the top and bottom cell arrays, and a wordline driver for driving a wordline of the top and bottom cell arrays, the method comprising the steps of:
selectively outputting a wordline decoding signal to the wordline driver;
varying a width of a restore pulse;
outputting the restore pulse having a varied width to the wordline driver to detect a weak cell of the upper and lower cell arrays;
controlling data in the form of a charge amount to be stored in a memory cell of each cell array to correspond to the size of the output restore pulse;
outputting bitline sensing levels varied to correspond to the size of the restore pulse; and
sensing a memory cell that first reaches a minimum sensing level among the varied bitline sensing levels to determine a weak cell.

15. The method of claim 14, wherein the step of varying the restore pulse includes the steps of
outputting first and second switching control signals for varying the width of the restore pulse; and
varying the width of the restore pulse in response to the first and second switching control signals.

16. The method of claim 15, wherein the data stored in the memory cell and controlled to correspond to the restore pulse is varied in such that a first charge amount<a second charge amount<a third charge amount when the restore pulse is varied such that a first restore pulse<a second restore pulse<a third restore pulse.

17. The method of claim 16, wherein the bitline sensing levels varied to correspond to the size of the restore pulse are varied such that a first voltage<a second voltage<a third voltage when the restore pulse is varied such that a first pulse<a second pulse<a third pulse.

18. The method of claim 15, wherein the restore pulse includes a first pulse delayed equivalent to a first turn-on time of one PMOS transistor when the first and second switching control signals are all in a relatively low level, a second pulse delayed equivalent to a second turn-on time of two PMOS transistors when either the first switching control signal or the second switching control signal is in a relatively high level, or a third pulse delayed equivalent to a third turn-on time of three PMOS transistors when the first and second switching control signals are in a relatively high level.

* * * * *